(12) United States Patent
Stetter

(10) Patent No.: US 7,911,010 B2
(45) Date of Patent: Mar. 22, 2011

(54) APPARATUS AND METHOD FOR MICROFABRICATED MULTI-DIMENSIONAL SENSORS AND SENSING SYSTEMS

(75) Inventor: Joseph R. Stetter, Hayward, CA (US)

(73) Assignee: KWJ Engineering, Inc., Newark, CA (US)

( * ) Notice: Subject to any disclaimer, the term of this patent is extended or adjusted under 35 U.S.C. 154(b) by 608 days.

(21) Appl. No.: 11/879,462

(22) Filed: Jul. 17, 2007

(65) Prior Publication Data

US 2008/0054382 A1  Mar. 6, 2008

Related U.S. Application Data

(60) Provisional application No. 60/807,536, filed on Jul. 17, 2006.

(51) Int. Cl.
*H01L 29/82* (2006.01)
(52) U.S. Cl. .......................................................... 257/415
(58) Field of Classification Search .......... 257/415–419, 257/E29.105
See application file for complete search history.

(56) References Cited

U.S. PATENT DOCUMENTS

| | | | |
|---|---|---|---|
| 6,602,791 B2 * | 8/2003 | Ouellet et al. | 438/696 |
| 6,746,891 B2 * | 6/2004 | Cunningham et al. | 438/52 |
| 2007/0132043 A1 * | 6/2007 | Bradley et al. | 257/414 |
| 2007/0145966 A1 * | 6/2007 | Shekhawat et al. | 324/71.1 |
| 2008/0233744 A1 * | 9/2008 | Kaul et al. | 438/684 |
| 2009/0219104 A1 | 9/2009 | Van Beek et al. | |

* cited by examiner

*Primary Examiner* — Cuong Q Nguyen
(74) *Attorney, Agent, or Firm* — Dinsmore & Shohl LLP

(57) ABSTRACT

A universal microelectromechanical MEMS nano-sensor platform having a substrate and conductive layer deposited in a pattern on the surface to make several devices at the same time, a patterned insulation layer, wherein the insulation layer is configured to expose one or more portions of the conductive layer, and one or more functionalization layers deposited on the exposed portions of the conductive layer. The functionalization layers are adapted to provide one or more transducer sensor classes selected from the group consisting of: radiant, electrochemical, electronic, mechanical, magnetic, and thermal sensors for chemical and physical variables.

40 Claims, 14 Drawing Sheets

APPARATUS AND METHOD FOR MICROFABRICATED MULTI-DIMENSIONAL SENSORS AND SENSING SYSTEMS

CROSS-REFERENCE TO RELATED APPLICATIONS

This application claims priority from U.S. Provisional Patent Application Ser. No. 60/807,536 filed Jul. 17, 2006, the entire disclosure of which is hereby incorporated by reference herein.

TECHNICAL FIELD OF THE INVENTION

The present invention is directed to microfabricated devices and methods for making them, and more specifically, to a unique apparatus and method for making multiple kinds of sensors on a single platform.

BACKGROUND OF THE INVENTION

Recently there has been renewed interest in sustaining economic growth through utilization of fossil energy resources, such as coal, in an efficient and environmentally responsible manner. Advanced technology for power plant and gasifiers are important for the clean production of electric power, hydrogen generation, gasification of methane, production of industrial chemicals, refined fuels with reduced impact on water resources, solid waste disposal and capture of carbon dioxide generated in the use of fossil fuels. To meet the demand of future energy innovation, these industrial gases will be produced by clean processes. Sensors and controls are important ingredients in any modern process plant and the coal utilization plants will not be different. The development of effective sensors is vital, and such important technology must be available when needed so there is an effective process and rapid public acceptance of fossil energy utilization. Sensors will not only enable the clean, efficient, and low-cost process, but will also provide for safety in the workplace, home and environment. There is a need for sensors to be located as close to the process points as possible for control of the processes. In addition, there is a need for sensors at exit gas streams that feed auxiliary processes for clean-up or conditioning. Moreover, safety sensors in the plant, the surrounding environment and public spaces would help accelerate public acceptability and the pace of coal technology utilization. The requirements for the sensor needed typically exceed the capabilities of current sensors. Several major limitations for current process sensors include: potential severe conditions in and near process streams, interferences of the complex process stream components and the desired analytical measurement, slow response times for analytical information and especially the cost of deployment and ownership. Similarly, safety and environmental sensors are typically too costly and lack performance for easy, wide-spread deployment.

One recent innovation in the manufacturing of devices is microelectromechanical systems (MEMS) technology. MEMS technology is based on a number of tools and methodologies, which are used to form small structures with dimensions in the micrometer scale (one-millionth of a meter). Significant parts of the technology have been adopted from integrated circuit (IC) technology. For example, almost all devices are built on wafers of silicon like IC's. The structures are realized in thin films of materials and patterns using photolithographic methods. There are three basic building blocks in MEMS technology: 1) deposit thin films of material on a substrate, 2) apply a pattern mask on top of the films by photolithographic imaging, and 3) etching the film selectively in the mask. A MEMS process is usually a structured sequence of these operations to form actual devices and patterns can be made by either etching or lift off methods.

One of the most basic building blocks of MEMS processing is the ability to deposit thin films of materials of different properties like insulators, semiconductors, or conductors or special reactivity. The thin films can have a thickness anywhere from a few nanometers to several hundred micrometers. Films can subsequently be locally etched or lifted off to form patterns in the MEMS processes some of which are described below.

MEMS deposition technology can be classified into two groups called 1) depositions that happened because of a chemical reaction, such as chemical vapor deposition (CVD), electro deposition, epitaxy, and thermal oxidation; or 2) depositions that occur because of a physical reaction: such as physical vapor deposition (PVD) or casting. The chemical reaction processes exploit the creation or removal of solid materials directly from the surface by chemical reactions and gas and/or liquid interactions with the substrate material. The solid material is usually not the only product formed by the reaction. By-products can include gases, liquids or even other solids. The physical deposition processes have in common that the material deposited is physically moved onto the substrate. In other words, there is no chemical reaction which forms the material on the substrate.

Lithography in the MEMS context is typically the transfer of a pattern to a photosensitive material by selective exposure to a radiation source such as light. Photosensitive materials are materials that experience a change in physical properties when exposed to a radiation source. If we selectively expose a photosensitive material to radiation (e.g. by masking some of the radiation), the pattern of the radiation on the materials is transferred to the photosensitive material exposed, as the properties of the exposed and unexposed regions differ. The washing of the unreacted materials leaves behind the patterned material in the desired pattern dictated by the mask. Subsequent depositions allow the layer to contact only the desired portions of the surface and subsequent removal of the photosensitive material allows the patterning of the deposited layer.

In order to form a functional MEMS structure on a substrate, it is necessary to etch the thin films previously deposited and/or the substrate itself. In general, there are two classes of etching processes: 1) wet etching where the material is dissolved when immersed in a chemical solution, or 2) dry etching where the material is sputtered or dissolved using reactive ions or a vapor phase etchant.

It is the desire for the development of a unique approach to generate a MEMS sensor platform with wide-spread applicability with advanced analytical capability and significant commercial potential. As such, there is a need for apparatuses and new methods for microfabricating multi-dimensional nano-sensor platforms. Accordingly, improved apparatus and methods for using the same are desired. Since MEMS processing has the largest applicability and advantage for large applications and not all chemical sensors applications are large, MEMS is not typically applied to the development of many kinds of chemical sensors. Therefore to achieve commercial viability for the MEMS processes with many chemical sensors, many sensors must be capable of being built on the same MEMS platform made with common MEMS processes. In addition to the versatility of the individual MEMS structure, multiple structure on the same die will result in both redundancy for higher reliability and long lifetime as well as each area functionalized differently providing orthogonal devices on the same platform. Accordingly these are presented herein.

SUMMARY OF THE INVENTION

The present invention relates to methods and apparatus for microfabricating multi-dimensional multi-use versatile sensor platforms. One aspect of the present invention is a universal microelectromechanical nano-sensor platform. The platform comprises a substrate having a surface with a first insulating surface layer; a microstructure first conductive layer deposited in one or more patterns on the surface to make several devices; a second insulation layer, wherein the insulation layer is configured such that it covers at least some portion of the first conductive layer's one or more patterns; a second conductive layer deposited in one or more patterns to form electrodes, wherein the device can be utilized for sensing; and one or more functionalization layers deposited on at least some portion of the second conductive layer, wherein the functionalization layers are adapted to provide one or more transducer sensor classes selected from the group consisting of: radiant, electrochemical, electronic, chemical, magnetic and thermal chemical sensors.

Another aspect of the present invention is a universal microelectromechanical nano-sensor platform. In this embodiment, the nano-sensor platform comprises: a semiconductor substrate including an upper surface, wherein the upper surface comprises an insulator or has an insulator layer thereon; a microstructure conductive layer deposited in a pattern on the surface to make several devices, wherein the conductive layer comprises one ore more filaments, bridges or filament pairs, and wherein the filaments are disposed above and parallel to the substrate configured such that there is an air gap between the filaments and the upper surface of the substrate; wherein the filaments comprise a size/width of less than 10 microns and a thickness of 1 micron or less.

Another aspect of the present invention is a universal microelectromechanical nano-sensor platform. The nano-sensor platform comprises: a semiconductor substrate including a surface; a microstructure polysilicon layer deposited in a pattern on the surface to make several devices, wherein the polysilicon layer comprises a first pair of filaments, wherein the filaments are disposed above and parallel to the semiconductor substrate with an air gap between the base of the filaments and the surface of the substrate; an insulation layer, wherein the insulation layer is configured such that the first pair of filaments of the polysilicon layer remain exposed and are not covered by the insulation layer; one or more functionalization layers deposited on the exposed pair of filaments of the polysilicon layer, wherein the one or more functionalization layers are adapted to provide one or more transducer platform classes selected from the group consisting of: radiant, electrochemical, electronic, mechanical and thermal; and wherein at least one pair of the filaments have a width of less than 10 microns.

The apparatus and methods for manufacturing nano-sensor platforms are advantageous for environmental and safety monitoring of gases. It can now be seen that the many different functionalization layers of the same MEMS platform provides for an almost boundless number of sensors and sensor arrays the are homogenous and heterogeneous on the exact same MEMS prepared platform. Not only can many sensors be arrayed on a single surface but the present invention allows diverse and different classes of sensors and related devices like preconcentrators to be prepared on the same substrate with no change to the underlying platform but only a change in the selection of the functionalization layer(s) in the final processing steps. The surprising number of orthogonally reactive sensors on the same platform constitute a new and more powerful sensing capability. In addition to the surprising more effective sensing, the new platform allows designs that are ultra low power for portability and versatility for the underlying platform [e.g., higher production volumes] making MEMS fabrication of chemical sensors practical for real-world application that are small while heretofore only high volume applications were economically possible and commercially viable. There are many additional couplings of this technology to the world of sensing such as thermal isolation techniques to lower power, the use of the ever increasing number of possible materials including plastics, flexible circuit materials for construction, and alternative selective and non-selective functionalization layers for use in liquids and gases. These and additional advantages will be apparent in view of the detailed description.

BRIEF DESCRIPTION OF THE DRAWINGS

While the specification concludes with claims particularly pointing out and distinctly claiming the invention, it is believed the same will be better understood from the following description taken in conjunction with the accompanying drawings in which:

Figure 1:
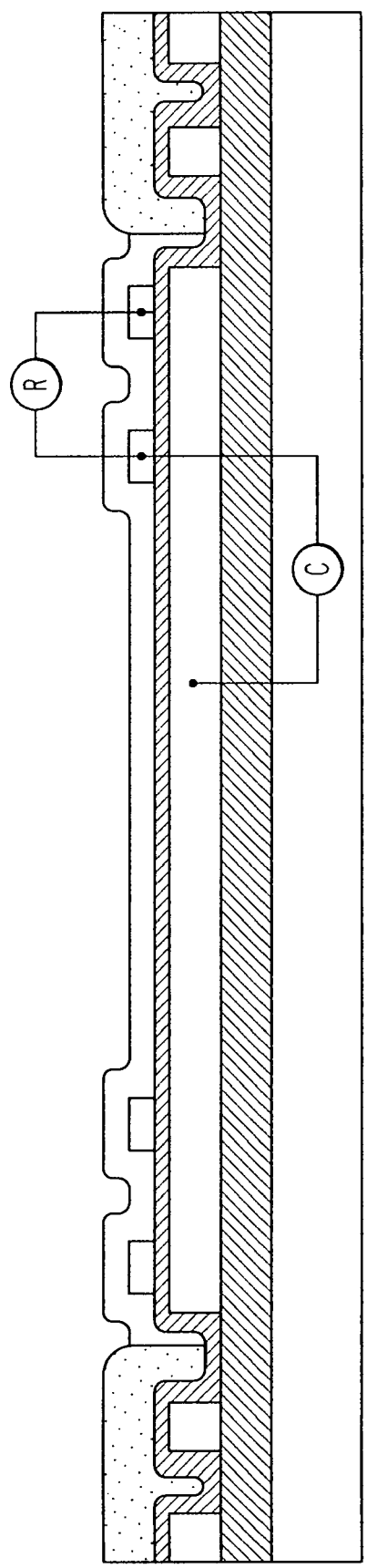
FIG. 1 is a cross-sectional illustration of an exemplary microelectromechanical sensor platform according to a first embodiment of the present invention.

The embodiments set forth in the drawings are illustrative in nature, and not intended to be limiting of the invention defined by the claims. Moreover, the individual features of the drawings and the invention will be more fully apparent and understood in view of the detailed description.

DETAILED DESCRIPTION OF THE INVENTION

Reference will now be made in detail to various embodiments which are illustrated in the accompanying drawings, wherein like numerals indicate similar elements throughout the views.

One embodiment of the present invention is the development of microfabricated sensors that can detect critical gases. Putting this technology into a low-cost MEMS package can add to the unique character of the resulting sensors. These MEMS sensors will be unique because of the combination of high-technological performance, tiny size, low power and low cost.

One aspect of the present invention is a universal microelectromechanical nano-sensor platform. The platform comprises a substrate having a surface with a first insulating surface layer; a microstructure first conductive layer deposited in one or more patterns on the surface to make several devices; a second insulation layer, wherein the insulation layer is configured such that it covers at least some portion of the first conductive layer's one or more patterns; a second conductive layer deposited in one or more patterns to form electrodes, wherein the device can be utilized for sensing; and one or more functionalization layers deposited on at least some portion of the second conductive layer, wherein the functionalization layers are adapted to provide one or more transducer sensor classes selected from the group consisting of: radiant, electrochemical, electronic, chemical, magnetic and thermal chemical sensors.

The sensing films (functionalization layers) can comprise electrolytes and then this sensor can function as an electrochemical sensor for CO, H2S, NOx, EtOH, or any suitable electroactive molecule. In an alternative embodiment, the sensing films (functionalization layers) can be polymers, selective adsorbents, composites, or other sensing materials such that the electronic sensor functions as a chemiresistor, chemicapacitor or an active device like a chemically sensitive transistor as the electronic properties of the functionalization layers are monitored as the target molecule interacts with the sensing film and the electrodes record this interaction.

In one exemplary embodiment, the functionalization layers comprise metal oxide [MOX] materials like SnO2, ZnO2, WO3, and these inorganic coatings will make electronic sensors like chemiresistors to atmospheric gases of all kinds including CO, H2S, NOx, hydrocarbons, H2, or the like. The MOX materials often can be operated at selected temperatures [0-600 C] in order to adjust reactivity and the above structure allow this controlled operation with heaters and temperature sensors below the functionalization layers.

In another exemplary embodiment, the underlying heater and temperature sensors can be used to control the temperature of operation making the sensor functionalization layers more or less reactive to specific target analytes. In yet another embodiment, the thermal isolation of the active area [heater, temperature sensor, electrodes, functionalization layers] can allow low power operation and fast response and good T control for accurate sensing using temperature dependence of signals. In one exemplary embodiment, filaments or bridges are designed to pass current and be heated but very tiny structure to reach high temperatures and low power requirements. Also, the filament are capable of being heaters themselves as well as electrodes and can provide surface to make sensors that rely on constant of variable temperature control for operation and generation of useful sensing signals.

The Steinhart-Hart equation is a widely used third-order approximation for temperature dependence of resistance:

$$T = \frac{1}{a + b\ln R + c(\ln R)^3}$$

where a, b and c are called the Steinhart-Hart parameters, and must be specified for each device. T is the temperature in Kelvin's and R is the resistance in ohms. To give resistance as a function of temperature, the above can be rearranged into:

$$R = e^{(\beta - \frac{\alpha}{2})^{\frac{1}{3}} - (\beta + \frac{\alpha}{2})^{\frac{1}{3}}}$$

where $$\alpha = \frac{a - \frac{1}{T}}{c}$$

and $$\beta = \sqrt{\left(\frac{b}{3c}\right)^3 + \frac{\alpha^2}{4}}$$

The error in the Steinhart-Hart equation is generally less than 0.02° C. in the measurement of temperature. As an example, typical values for a thermistor with a resistance of 3000 ohms at room temperature (25° C.=298.15 K) are:

$a = 1.40 \times 10^{-3}$ $b = 2.37 \times 10^{-4}$ $c = 9.90 \times 10^{-8}$

More frequently for metals or alloys a first order equation approximated the coefficient of resistance where $(R-R_0) = k*(T-T_{ref})$ that is delta R=K delta T where K is the coefficient of resistance and can be positive or negative. For metals like Pt is can be 0.003 ohms per degree and for metal oxides can be much larger. It can be an advantage to select materials and designs that are very stable and can operate in the desired temperature range and in the desired matrix [air or liquid or other]. The resistor can be coated to give it resistance to corrosion and other robustness.

In a further embodiment of the present invention, encapsulation between active area and bond pads allows for easy placement of the functionalization layers without shorting of leads to the bond pads. The bond pads allow easy connection to the outside world, i.e. easy packaging into chip carriers, DIP (Dual inline package), TO-type header, and other type packages convenient for use to hook into electronic circuits.

One embodiment of the present invention, a sensor platform 100, is illustrated in FIG. 1. In this embodiment, the sensor platform 100 comprises a substrate 110 including a surface with a first insulating surface layer 112; a microstructure of first conductive layer 115 deposited in one or more patterns on the surface to make several devices, wherein the first conductive layer 115 comprises a first pair of filaments 120, wherein the filaments are disposed above and parallel to the semiconductor's substrate 110 with an air gap between the base of the filaments and the surface of the substrate; a second insulation layer 117, wherein the second insulation layer 117 is configured such that the first pair of filaments 120 on the first conductive layer remain exposed and are not covered by the insulation layer; and one or more functionalization layers 125 deposited on the exposed pair of filaments 120 of the polysilicon layer, when the functionalization layers 125 are adapted to provide one or more transducer platform classes selected from the group consisting of: radiant, electrochemical, electronic, mechanical, and thermal sensors.

Figure 2A:
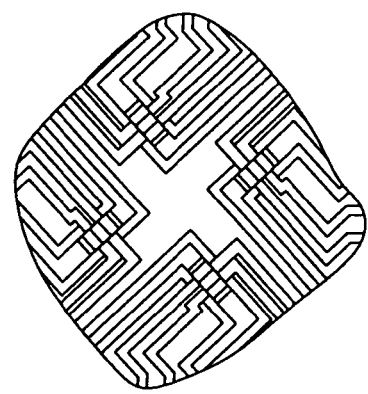
FIG. 2 is a top view of exemplary patterns of an exemplary microelectromechanical sensor platform according to a second embodiment of the present invention.
Figure 2B:
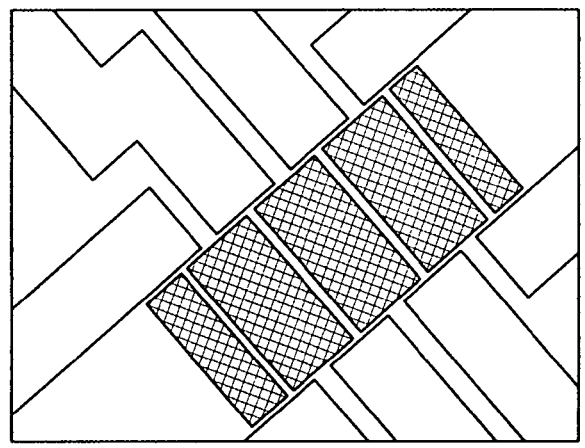
Figure 2C:
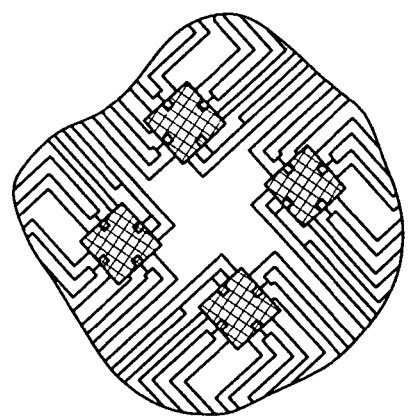
Figure 2D:
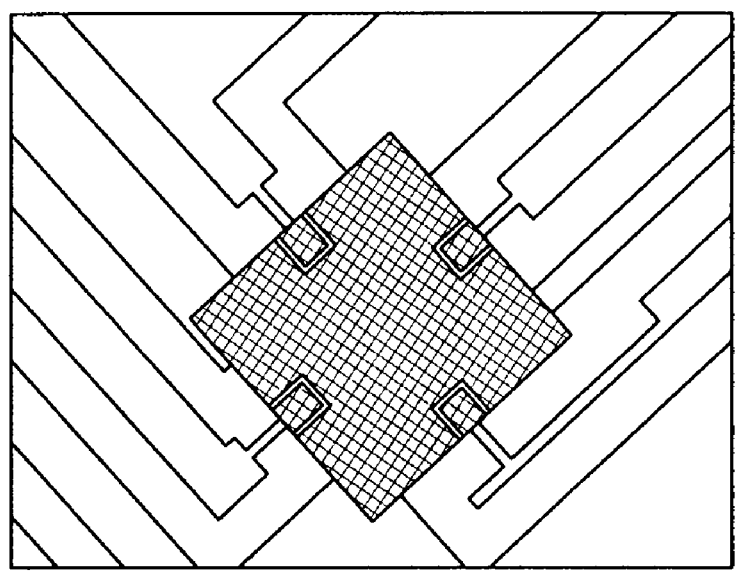

Another embodiment of the present invention is a method of manufacturing the sensor platforms. In this embodiment, the sensor platforms are fabricated by p-type silicon wafers upon which a sacrificial layer of about two microns of polysilicon is deposited. In one exemplary embodiment, loop bridges can be fabricated on four edges of a square well and/or straight bridges, bridging long, narrow well can be fabricated. The polysilicon can be patterned to form loops or bridges of different sizes, such as 5 or 10 microns wide, and 25, 50, or 100 microns long. The conductive structures can be coated with aluminum to make them conductive and then passivated with a micron thick layer of SiO2 on top. The SiO2 passivation is etched away from the area above the filaments leaving the leads passivated. This etching creates a well above the filaments and allows them to be functionalized independent from the lead and bond pads. FIG. 2 illustrates an exemplary structure containing 4 bridges or 16 bridges for a total of 32 leads. FIG. 2a illustrates a photomicrograph of the center of a chip area of straight bridges. FIG. 2b is a close-up photograph of straight bridges for one structure of the four. As one skilled in the art will appreciate, redundant structures allow for easy evaluation, and estimation of yield and process issues. In addition, the cost difference between building one or twenty structures on the substrate in the MEMS world is an insignificant difference. FIGS. 2c and 2d illustrate photomicrographs of loop bridges according to another embodiment of the present invention.

In one exemplary embodiment, active sensing areas are made to contain 4 bridges so that they could be operated in pairs or sequentially for longer lifetime for the device. There are generally multiple areas on each die so that there could be multiple devices on each die.

In an alternative embodiment, the nano-sensor platform can be functionalized with nanostructures such as carbon nanotubes or CNTs and/or composite materials like CNT/polymer mixtures to realize humidity and a large number of chemical and biochemical sensors. The functionalization of this MEMS structure with metal oxides can be used to create a versatile number of chemiresistor or chemicapacitor sensors for gases like ozone, CO, or hydrocarbons. Further, because of the multiplicity so easily achieved in MEMS, many of the same kind or many different sensors can be prepared on the same substrate by applying the required functionalizations to different areas of the MEMS die that is populated with one or more of the versatile sensing platforms. It has been shown that heterogeneous electronic noses (sensors) are more powerful that the homogenous ones, i.e. sensor platforms that can house more than one class of sensors simultaneously are more powerful than those with only a single type of sensor. In one exemplary embodiment, selective coatings for elevated temperature sensors are possible on the filament/bridge sensors, wherein the coatings are capable of operation at high temperatures with and without the conductor electrode over the insulation layers.

Other exemplary embodiments of the present invention include: The bridges configured with and without insulation; the bridges configured with and without functionalization layers; functionalization layers with electrolytes to make electrochemical sensors; functionalization layers with metals such as Pt to make combustible gas sensors; functionalization layers with metal oxides to make chemiresistors and chemicapacitors; functionalization layers with polymers to make chemiresistors and chemicapacitors; and functionalization layers with sorbents to make preconcentrators.

In one exemplary embodiment, the multiple areas on a single substrate are utilized to make arrays of the same or different devices including sensors, preconcentrators, transistors, etc.

Figure 3:
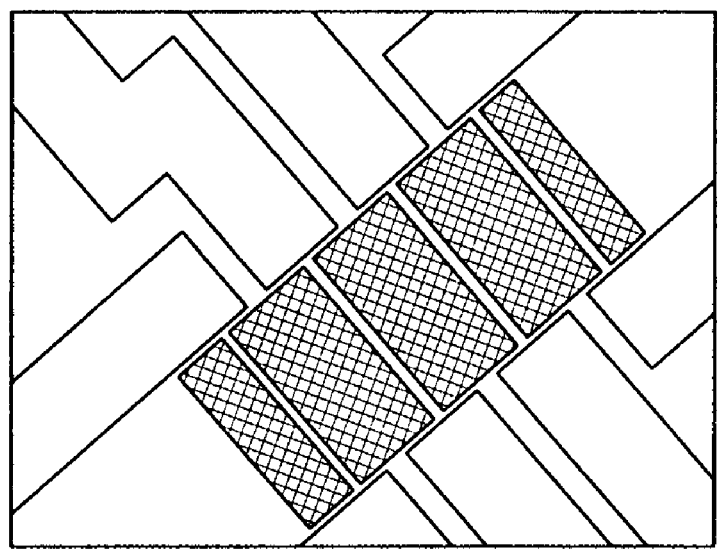
FIG. 3 is a top view of exemplary patterns of an exemplary microelectromechanical sensor platform according to a third embodiment of the present invention.
Figure 4A:
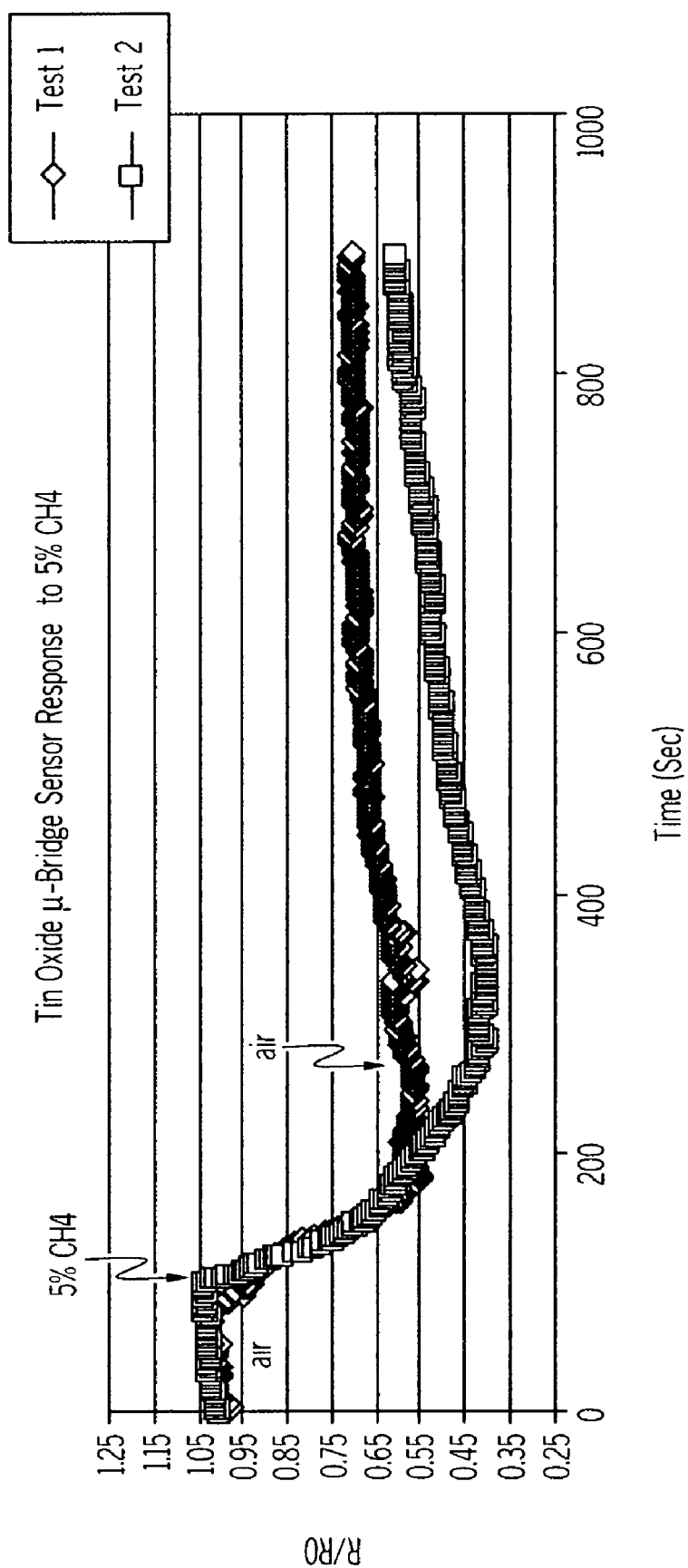
FIG. 4 is an exemplary sensor response chart according to a fourth embodiment of the present invention.
Figure 4B:
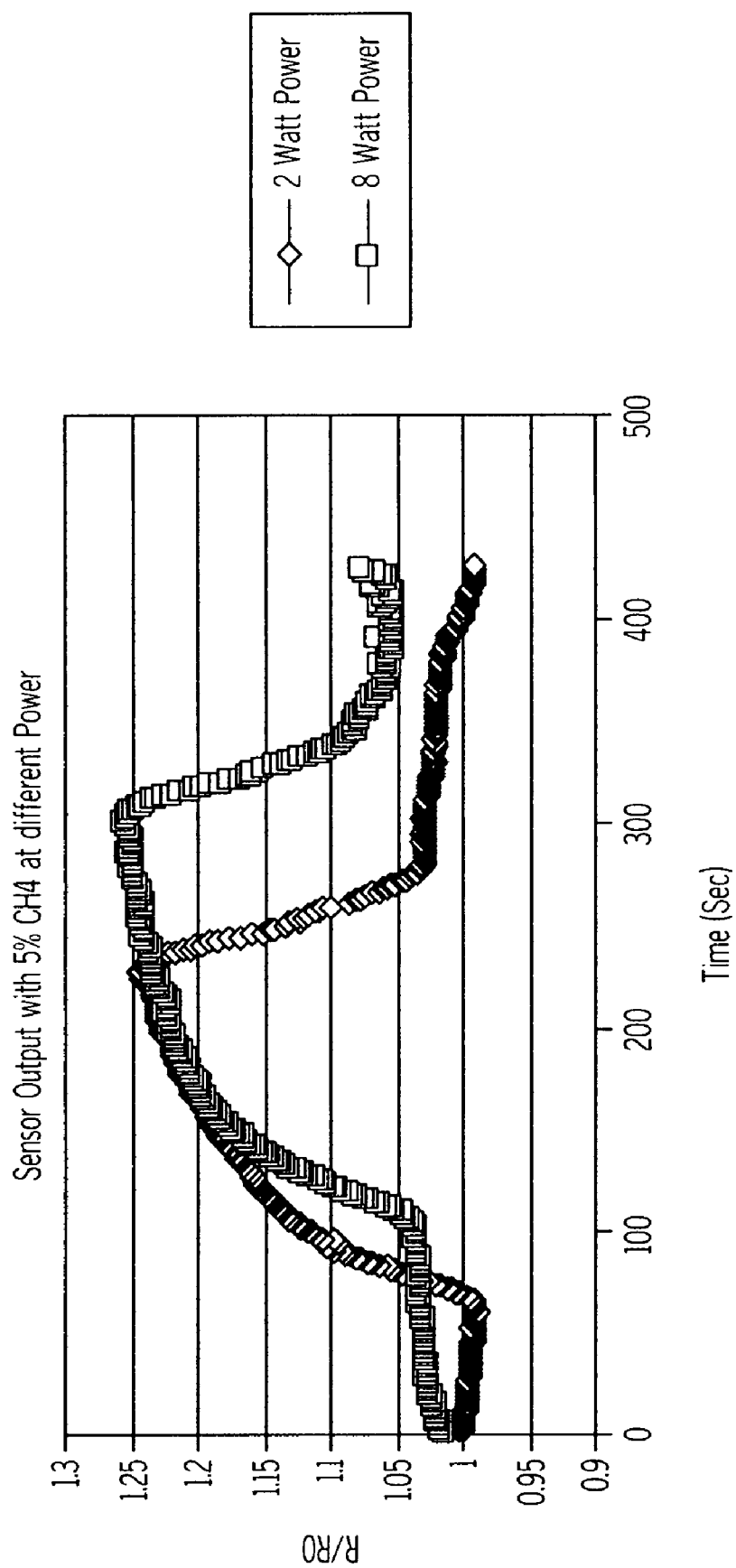

In another embodiment of the present invention illustrated in FIG. 3, a nano-sensor platform 300 is used to fabricate a combustible gas sensor. Bridge number two 302 is functionalized with tin oxide ($SnO_2$) layer. The sensor is then operated by passing current over bridges number one 301 and three 303 to heat the area and measuring the resistance of bridge two 302 (centered between one and three). In this exemplary embodiment, the sensor is configured for testing with methane. FIG. 4 illustrates the response of the sensor to 5% methane. As can be noted, the change in resistance is quite large and repeatable on two consecutive tests, but the recovery time is slow.

Figure 5:
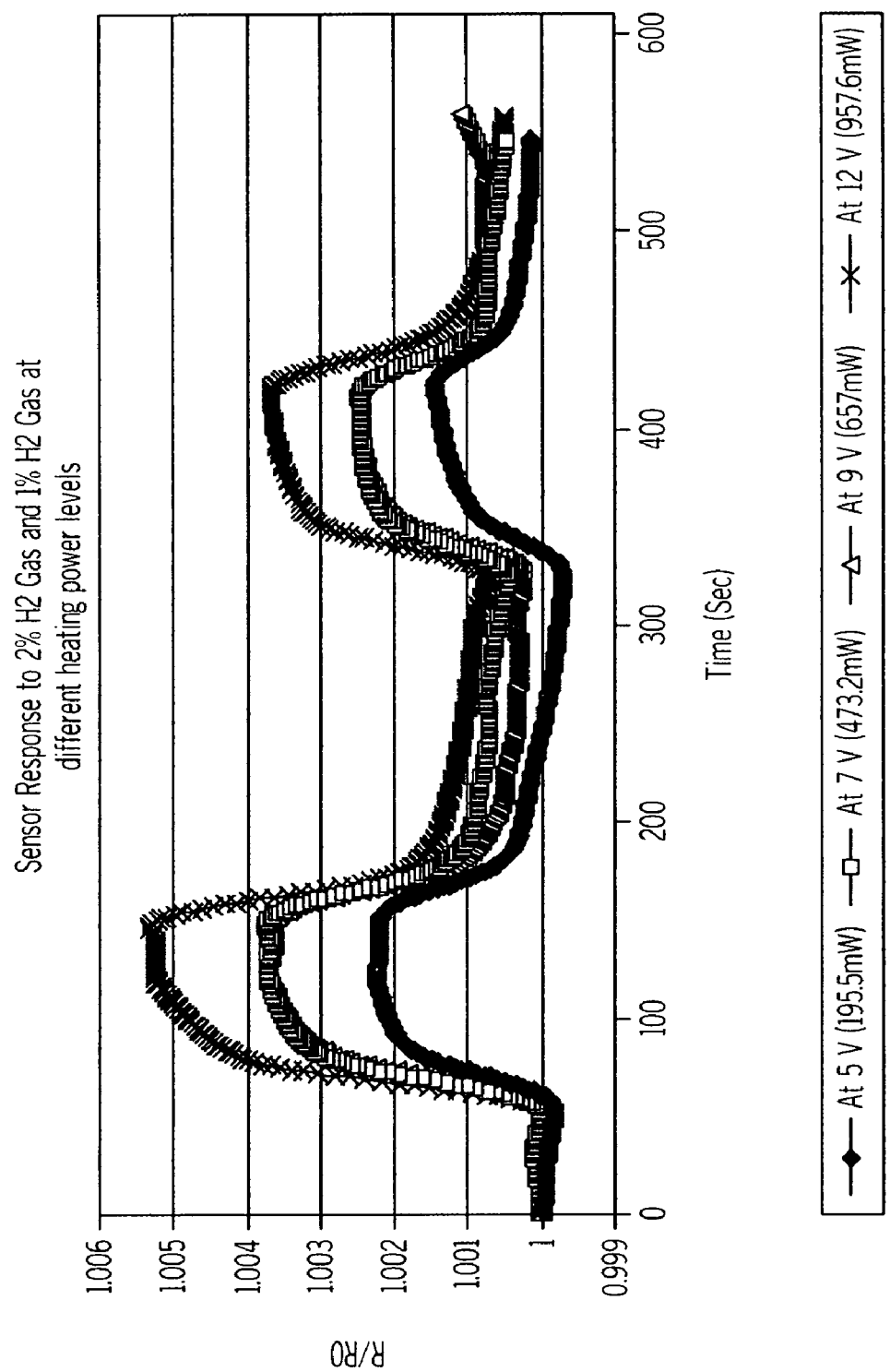
FIG. 5 is an exemplary sensor response chart according to a fifth embodiment of the present invention.

In a similar embodiment, a second nano-sensor platform was functionalized with platinum by applying high surface area platinum particles (submicrons or nano-particles) to one heater bridge. This bridge was then used as the sensor, while the adjacent bridges were used to heat the device. FIG. 5 illustrates the response of the sensor to 2% and 1% hydrogen at increasing temperatures (applied power). As can be seen by one skilled in the art, this sensor showed a very rapid response and recovery to hydrogen. The power indicated in the graph legend is total power, across three filaments. One filament consumed approximately 100-200 mW. In this experiment, the structures were not optionalized for power consumption or response time, magnitude or selectivity. But rather these experiments demonstrated the feasibility of multi-classes sensors on a platform.

There are many adaptations of these above devices that will allow a variety of sensors and sensing capabilities to be realized. For example the lock and key electrode configuration is particularly suited for chemiresistors and chemicapacitors. The bridges and filaments are convenient for physical sensors like flow and thermal conductivity or thermoelectric sensing films but also can be used as electrodes so that they also are amenable for electronic sensors [chemiresistors and chemicapacitors and active devices like chemically sensitive transistors]. The many different functionalization layers that are compatible with the MEMS structure to create the many device is truly surprising and novel. For example, functionalization with an electrolyte onto conductive filaments [not covered with insulator] or conductive patterns [lock and key] allow the realization of amperometric electrochemical sensors. Amperometric gas sensors [AGS] can be used for many analytes in gas and or liquid phases at room temperature and elevated temperatures [e.g. fluidic phases of matter].

Figure 6:
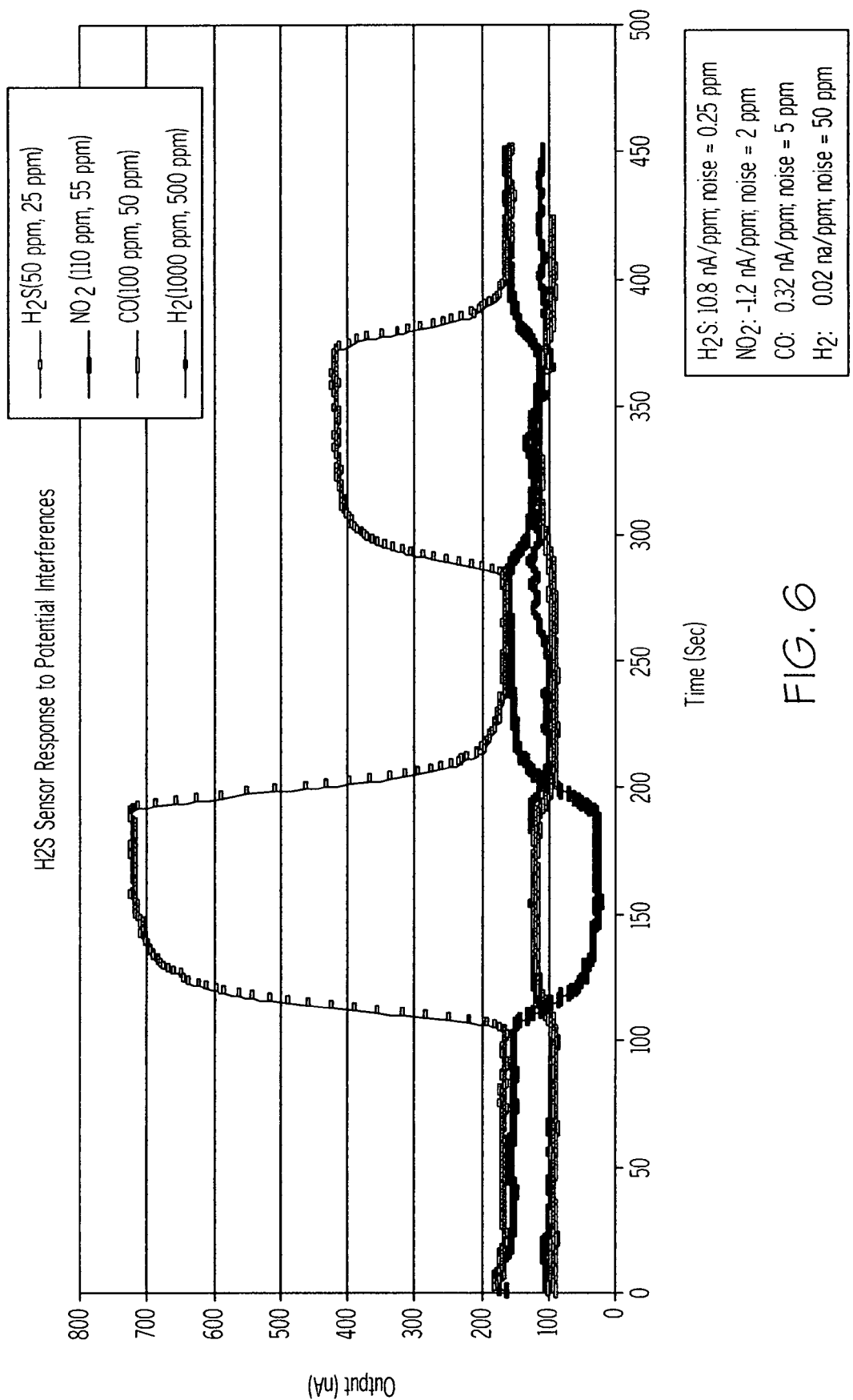
FIG. 6 is an exemplary sensor response chart according to a sixth embodiment of the present invention.

In another experiment, an electrochemical sensor is created on the platform. In order to create an electrochemical sensor, the bridge is functionalized with a platinum deposition using a proprietary form of the composite. The platinum particles of one micron or less in size (nano-particulate platinum) can be deposited by micro-pipetting onto four different regions of the bridge structure. In this case, the bridge element serves as electrodes contacting the thin and discontinuous platinum particle film. A thin film of electrolyte (as the functionalization layer) is placed over the surface of the electrodes providing an electrolyte bridge between the platinum particle functionalized polysilicon electrodes. FIG. 6 illustrates the initial results for this functionalized electrochemical system when the sensor is challenged with samples of different electrochemically active gases. The sensor is optimized for $H_2S$ (sensing electrode bias=0 mW vs. Pt/air), and tested with four different gases—hydrogen sulfide, carbon monoxide, nitrogen dioxide, and hydrogen. The electrolyte used for these preliminary tests is a thin film of sulfuric acid, and no effort was made to isolate the referenced electrode. As shown in FIG. 6, the hydrogen sulfide response is quite stable and linear with concentration. Whereas the other three gases show responses of much lower magnitude. The carbon monoxide response on a per ppm basis is several thousand times smaller than the $H_2S$ response, providing excellent selectivity for this sensor. The CO response can be reduced even more with the use of a gold catalyst for the working electrode, and the $NO_2$ response can be minimized with an appropriate sensing electrode bias.

Figure 7:
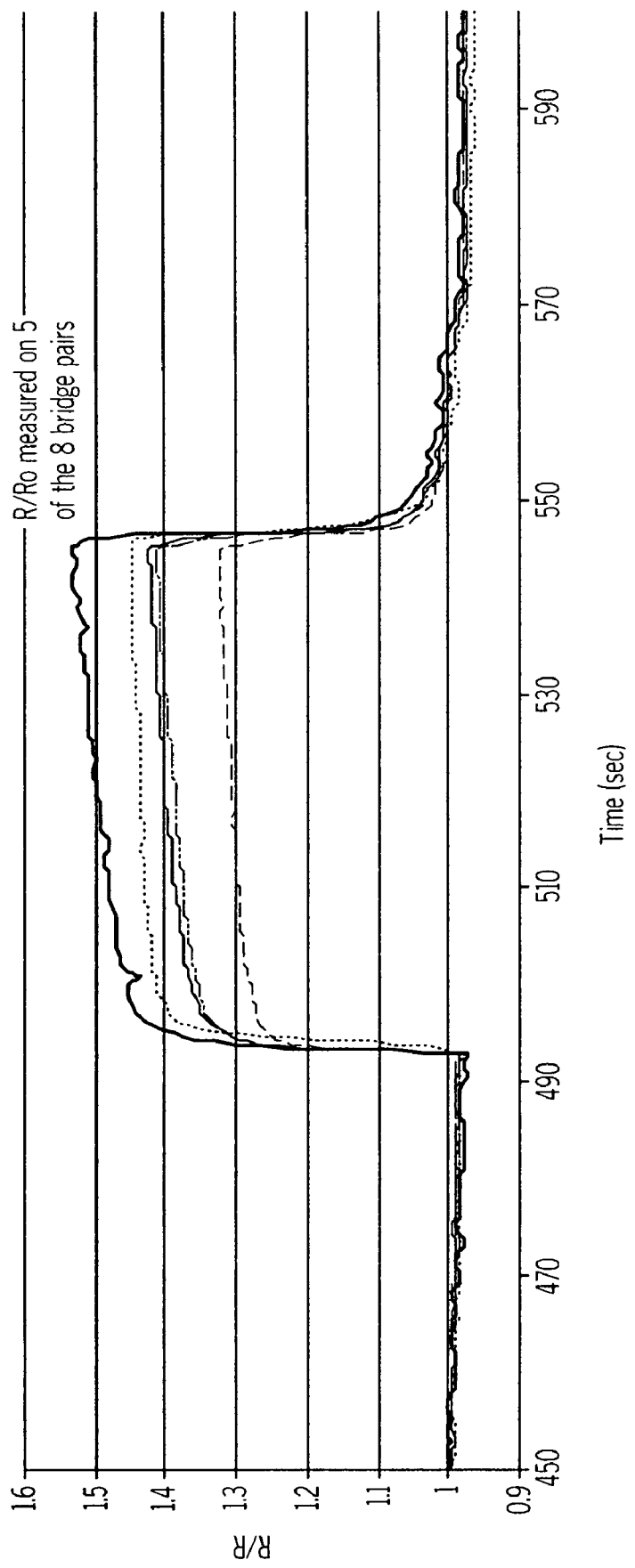
FIG. 7 is an exemplary sensor response chart according to a seventh embodiment of the present invention.

Yet another experiment was conducted to create a conductive polymer sensor on the sensor platforms of the present invention. To test a third sensor class on the same microbridge platform, a polymer bridge with nano-particulate carbon and with single walled carbon nano-tubes was coated on the MEMS sensor platform. This sensor will absorb vapor molecules, for example toluene, and exhibited a change in physical properties such as resistance or capacitance. In this experiment, the resistance of the film was monitored when the sensor is exposed to toluene vapors. The change in resistance as measured across five of the eight bridge pairs while the device was exposed to approximately one percent (or 10,000 PPM). The response from these five functionalized layers is shown in FIG. 7. Signals were obtained from three carbon materials: nano-particles, nano-structured carbon, and purchased single wall carbon nano-tubes that are 90% pure. All formulations produced responses as illustrated in FIG. 6.

As can be seen from the experiments above, the polysilicon bridges form the foundation for multiple classes of sensors. In the experiments above, three classes of sensors were demonstrated, thermal (catalytic and thermal conductivity), electronic (heated metal oxide or mox, and polymer or polymer composite chemiresistors), and electrochemical (amperometric sensor for $H_2S$ and other electro-active gases).

The present invention comprises a single platform having an electrode array on a dielectric material compatible with several sensor classes in functionalization layers that enable different sensor classes and types to be built on the same platform. Thus, the same single platform can have multiple functionalization layers and different classes of sensors addressing different target analytes with different specifications. In one exemplary embodiment the devices formed on the platform are configured such that they operate in an elevated temperature at very low power, such as less than ten mW.

Figure 8A:
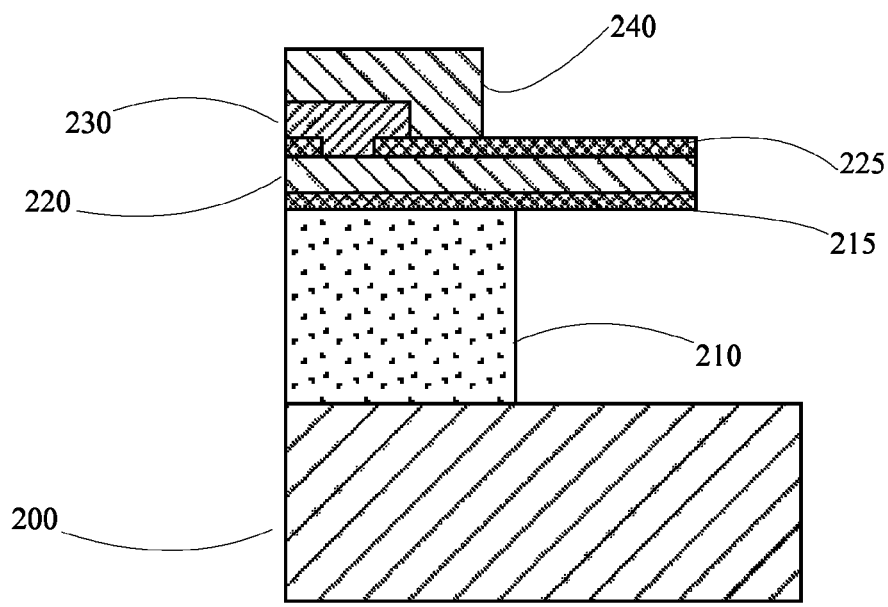
FIG. 8 is a cross-sectional illustration of an exemplary microelectromechanical sensor platform according to a eighth embodiment of the present invention.
Figure 8B:
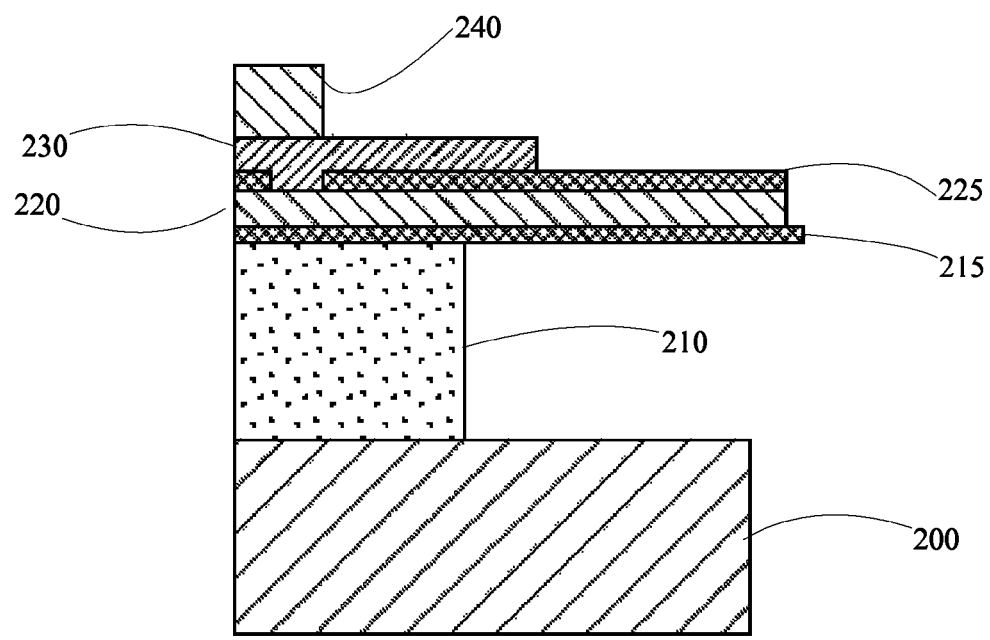
Figure 9A:
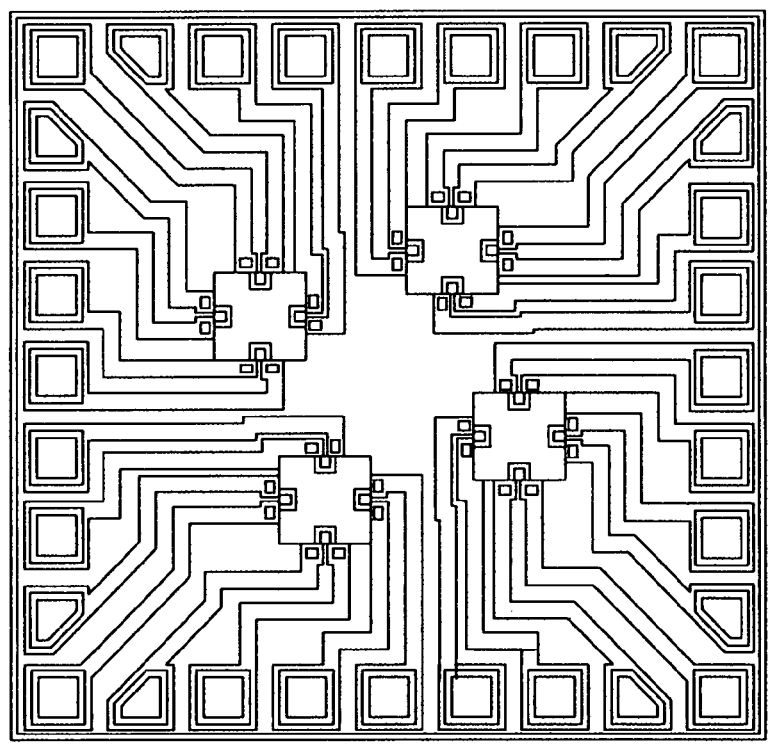
FIG. 9 is a cross-sectional illustration of an exemplary microelectromechanical sensor platform according to a ninth embodiment of the present invention.
Figure 9B:
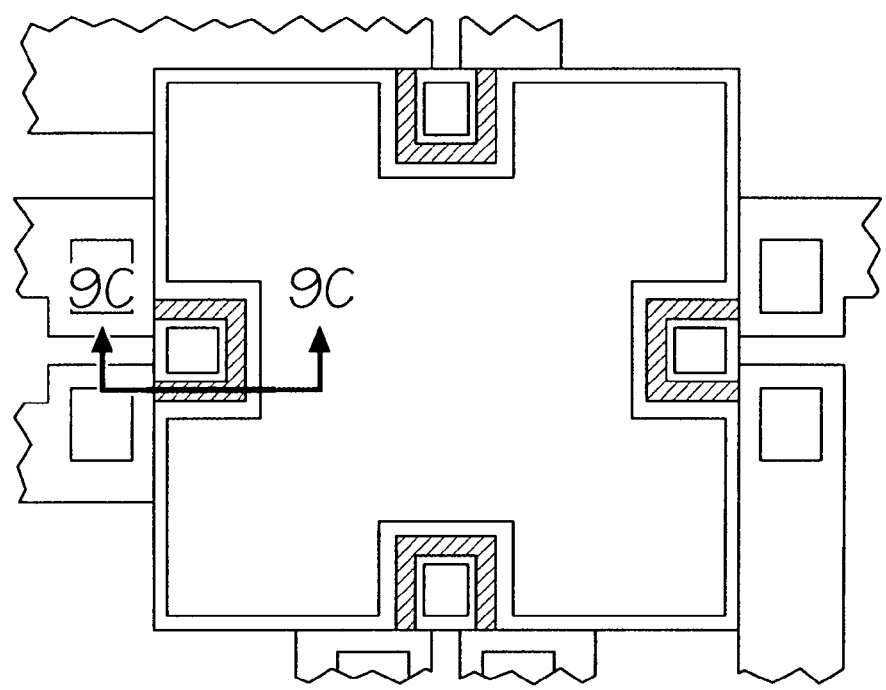
Figure 9C:
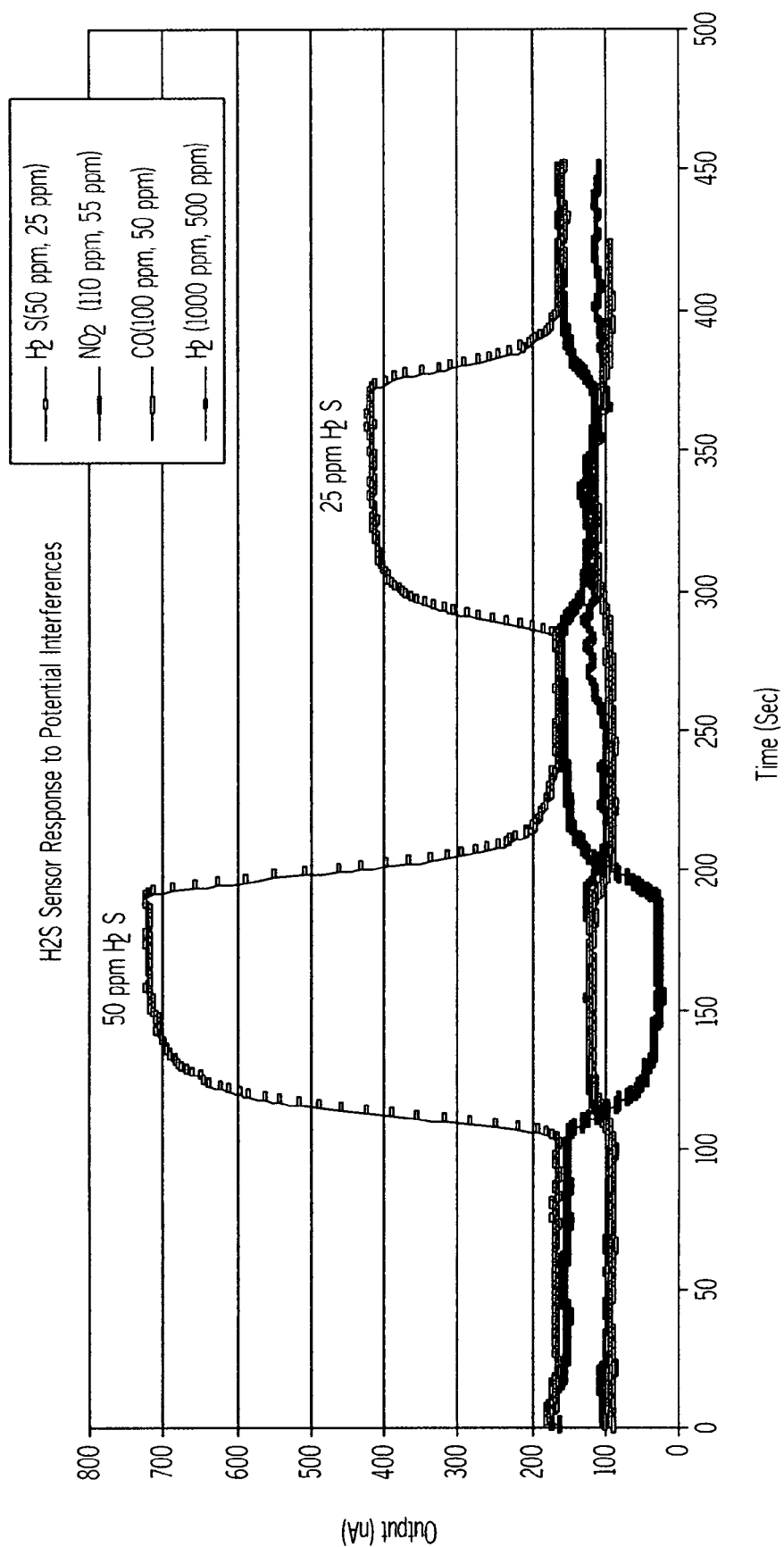
Figure 9D:
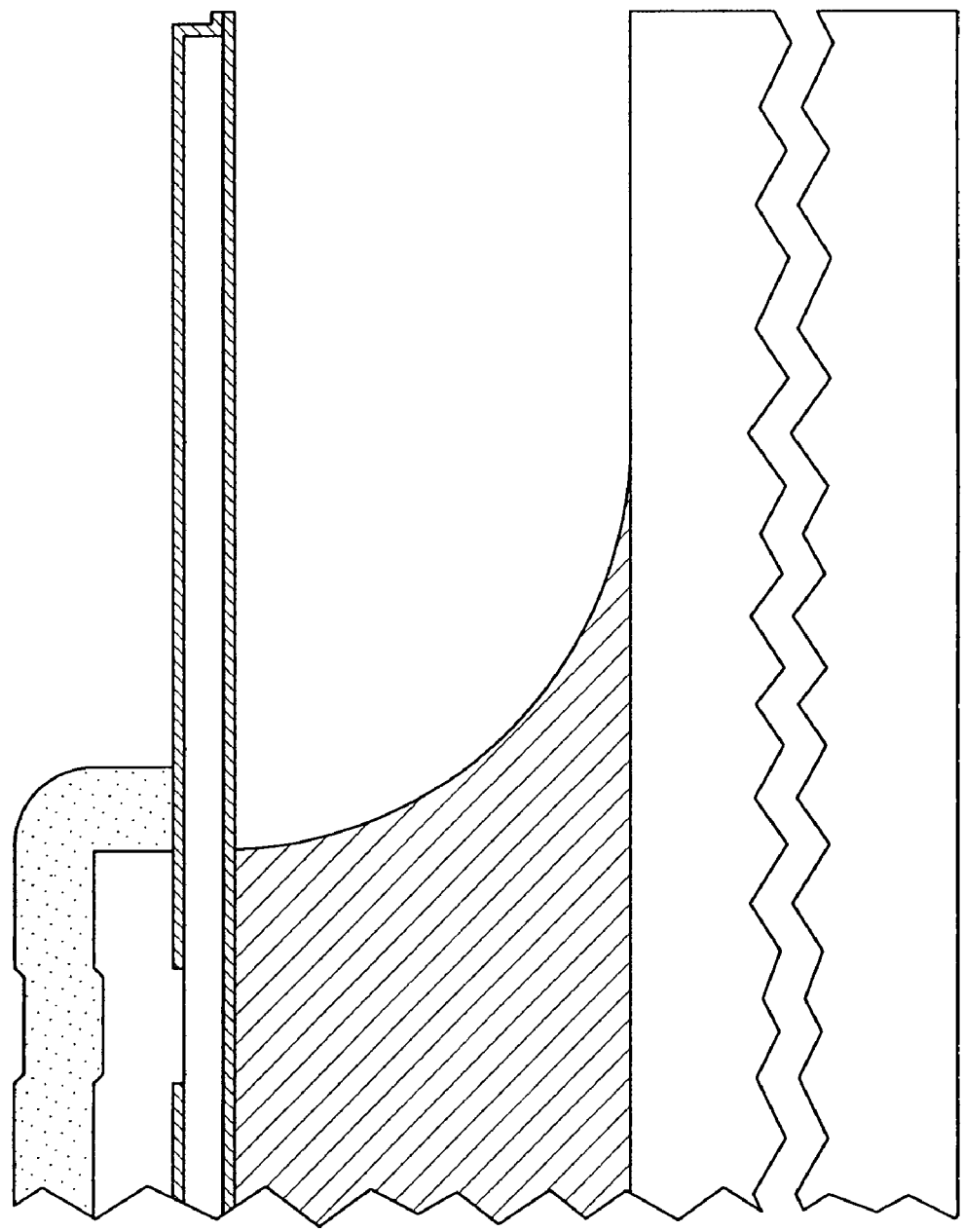

One embodiment of the present invention is illustrated in FIG. 8. In this embodiment, a micro-bridge sensor chip platform is illustrated. FIG. 8 illustrates a cross-section of a bridge platform according to one embodiment of the present invention. In this embodiment, the universal microelectromechanical nano-sensor platform comprises a semiconductor substrate including a surface, such as a silicon wafer 200, a micro-structure polysilicon layer 210 deposited in a pattern on a surface to make several devices wherein the polysilicon layer 210 comprises silicon oxide which is deposited and utilized to create the bridges. The silicon nitride layer 215 is passivated over the silicon oxide 210 on which then a polysilicon layer 220 can further be deposited. The polysilicon layer 220 is conductive, and can be used as resistive heaters and as electrodes. The platform further comprises another layer of silicon nitride 225 over the polysilicon, etched to have an opening to allow an aluminum layer 230 to be an electrical contact with the polysilicon layer 220. In one exemplary embodiment, an encapsulation layer 240 is placed over the aluminum layer 230 to provide environmental and other protections to the layer.

In one exemplary embodiment, the sensor platform comprises one or more electrodes having polysilicon bridges and the electrodes are functionalized and have a width of one micrometer wherein the sensor platform has a power consumption below 50 mW. In another embodiment, the polysilicon bridge is functionalized with a catalyst, wherein the catalysts is configured such that the polysilicon bridge becomes a combustive gas sensor.

Illustrated in FIG. 9 is an exemplary universal MEMS nano-sensor platform according to another embodiment of the present invention. In this embodiment, the sensor contains electrodes on a substrate inert to analyte an electrolyte. In one exemplary embodiment, the substrate contains a heater and a temperature sensor. The universal MEMS nano-sensor platform has a thermal sync configured for optimal/minimum power use at a given temperature. The platform comprises one or more sensing layers which are designed for multiple use, such as electrochemistry, electronic and thermal sensing. One or more functionalization layers are added to the sensing layers, and these functionalization layers add sensitivity, selectivity, and encapsulation from environmental insult. The MEMS chemical platform can detect virtually all the chemical analytes required in coal gasification: methane and hydrogen in thermal sensors, $H_2S$, carbon monoxide (CO), $NO_x$, $NH_3$, $Cl_2$, electrochemically, and hydrocarbons with electronic sensors.

Figure 10:
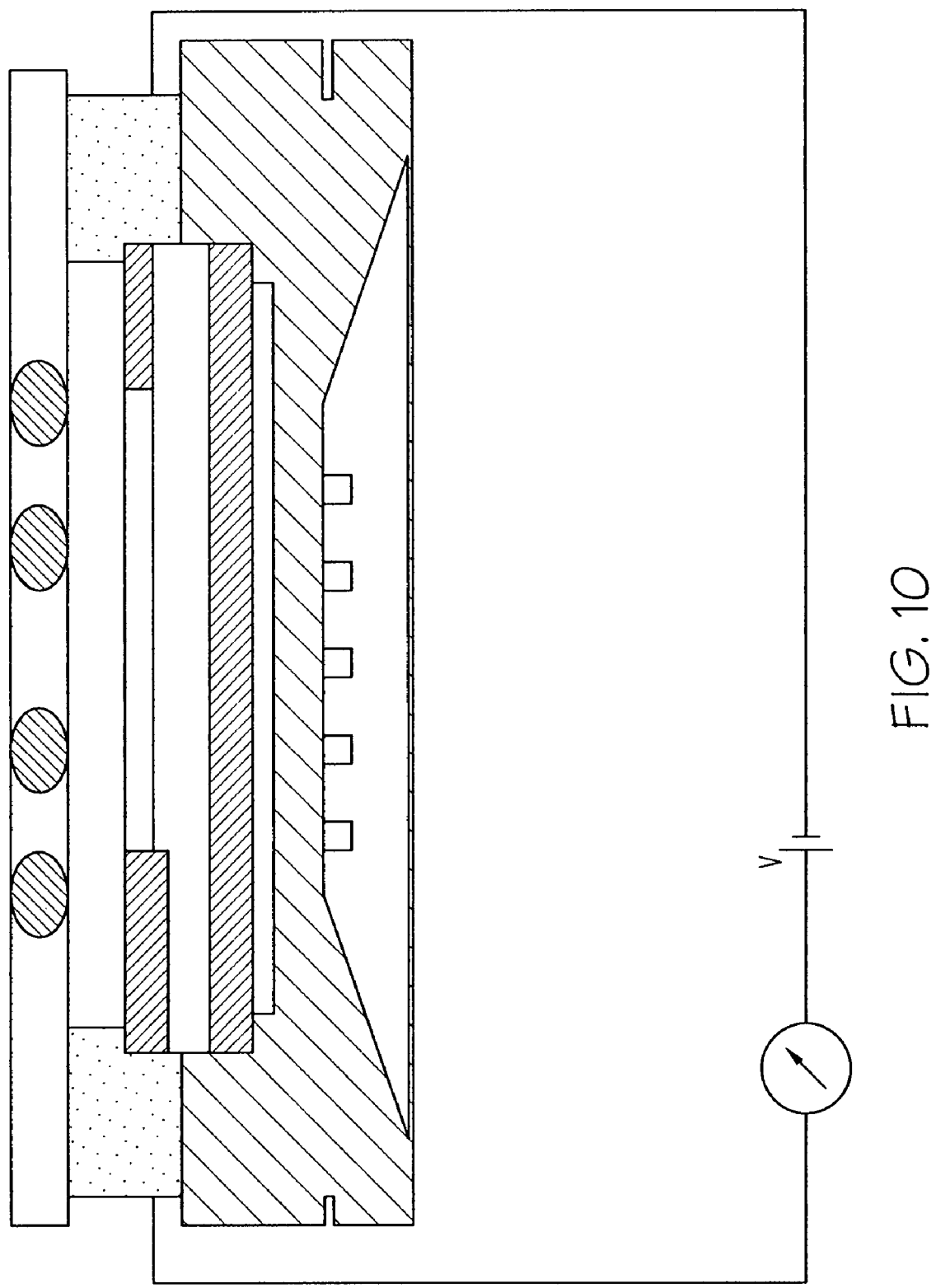
FIG. 10 is a cross-sectional illustration of an exemplary microelectromechanical sensor platform according to a tenth embodiment of the present invention.

As illustrated in FIG. 10, the MEMS sensor platform 400 comprises a substrate 410 and one or more heater and temperature sensors 415 below the surface of the substrate 410. In one exemplary embodiment, the heater and temperature sensor are embedded in the substrate 410, whereas in an alternative embodiment, a portion of the substrate on the opposite side of the surface in which a platform will be built is removed, and a heater and sensor is placed on the underside of the substrate 410. One or more sensing layers 420 are deposited on the substrate. In one exemplary embodiment, the sensing layers are deposited in a pattern comprising bridges and loops to create one or more sensing layers. On the sensing layer, one or more functionalization layers 425 are applied on the sensing layer. The functionalization layers 425 may comprise one or more nano-structures which can add sensitivity, selectivity and encapsulation to the sensing layer. An overall encapsulation layer 430 may be applied depending on the type of sensor class being built.

In one exemplary embodiment of the present invention, the polysilicon layer is deposited in a pattern on the surface of the substrate in a lock and key electrode pattern. This lock and key pattern comprises an array and allow the electrodes to be used for capacitive and resistive measurements as well as a four-point probe. In one exemplary embodiment, the platform can have variable length polysilicon bridges. In this embodiment, the bridges can be used for heating and the sensing layer can be deposited onto an exposed aluminum lead forming a sensing layer.

Figure 11:
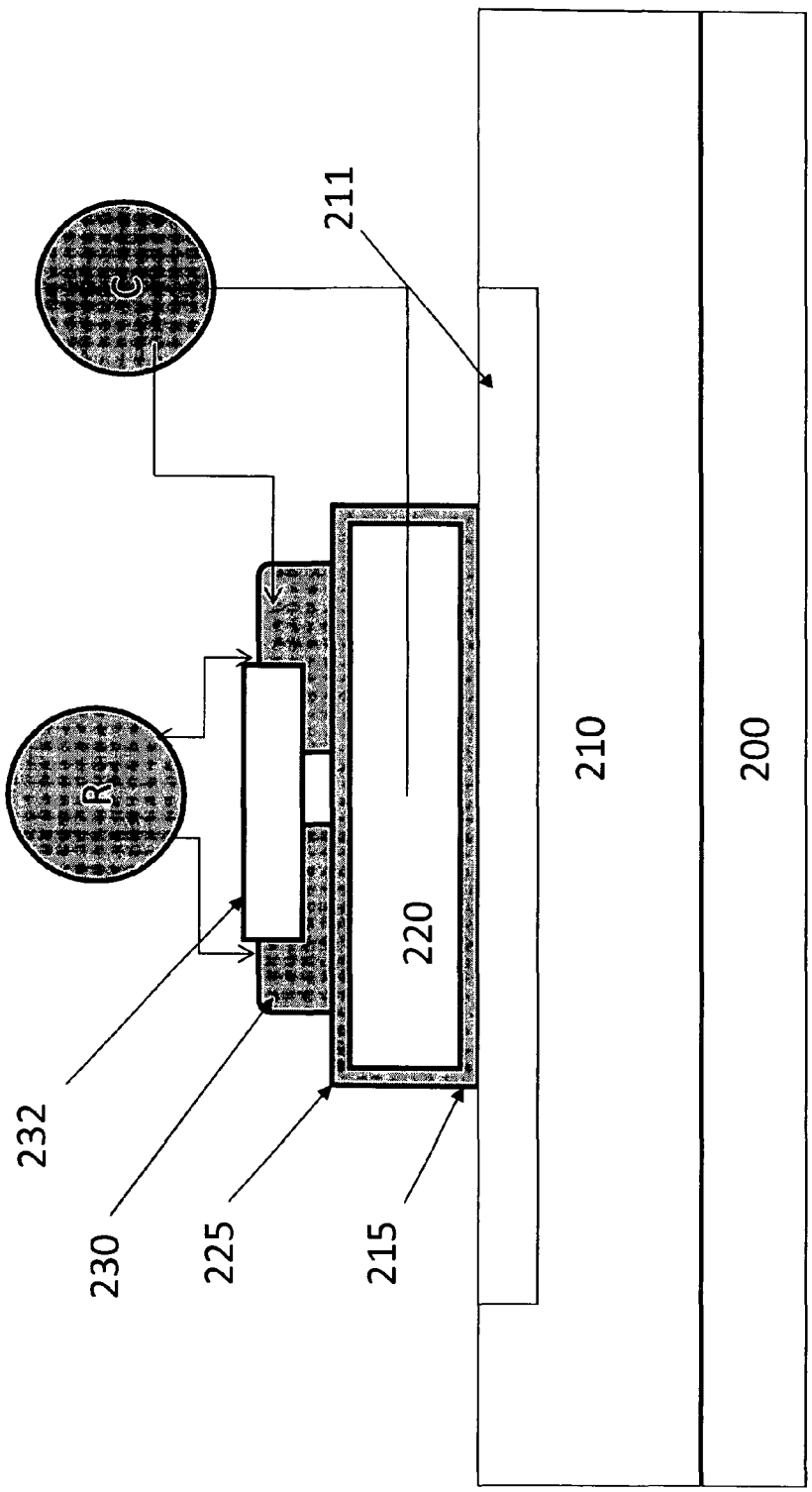
FIG. 11 is a cross-sectional illustration of an exemplary microelectromechanical sensor platform according to another exemplary embodiment of the present invention.

One embodiment of the present invention is illustrated in FIG. 11. In this embodiment, the center of the micro-bridge sensor chip platform is illustrated as an edge view. FIG. 11 illustrates a cross-section of the center to the bridge platform. In this embodiment, the universal microelectromechanical nano-sensor platform comprises a semiconductor substrate including a surface, such as a silicon wafer 200, a micro-structure polysilicon layer 210 deposited in a pattern on the surface to make several devices wherein the polysilicon layer 210 comprises silicon oxide which is deposited and utilized to create bridges. In this particular illustrated embodiment, the polysilicon layer 210 is deposited in a pattern to create a 5 micron air gap 211 in the center of the sensing element/device. A silicon nitride layer 215 is passivated over the silicon oxide 210 on which then a second polysilicon layer 220 is further deposited. The polysilicon layer 220 is conductive and can be further used as resistive heaters and as electrodes. The platform further comprises another layer of silicon nitride 225 over the polysilicon layer 220. An aluminum layer 230 is deposited on the silicon nitride 225 in a pattern as a single, double or other desire pattern to form one or more electrodes. In a further embodiment, a functionalization material 232 can be deposited on the aluminum layer, thereby creating a functionalized electrode, wherein the functionalization layers 232 are adapted to provide one or more transducer platform classes selected from the group consisting of: radiant, electrochemical, electronic, mechanical and thermal sensors.

The foregoing description of the various embodiments and principles of the invention has been presented for the purpose of illustration and description. It is not intended to be exhaustive or to limit the invention to the precise forms disclosed. Many alternative, modifications, and variations will be apparent to those skilled in the art. It can be envisioned by one skilled in the art both how to make alternative devices and layers for different functionality and also how to make this structure out of different materials like plastics with different processing tools and capabilities. For example, some principles of the invention may be used in different sensor platform patterns other than bridges. Moreover, although multiple inventive concepts have been presented, such aspects need not utilized in combination, and various combinations of the inventive aspects are possible in light of the various embodiments provided above. We can further provide examples of specific sensors like TCD [thermal conductivity detectors] or ozone or CO or H2S or even antibody detection with the platform described herein. There have been books dedicated to physical, chemical, and biological sensors wherein the functionalization layers are described and these can be interfaced to the MEMS platform described here to provide sensing capability. Accordingly, the above description is intended to embrace all possible alternatives, modifications, combinations and variations that have been discussed or suggested herein, as well as all the others that fall within the principles, spirit and broad scope of the invention as defined by the claims.

What is claimed is:

1. A universal microelectromechanical nano-sensor platform comprising;
    a substrate including a surface with a first insulating surface layer, wherein the first insulating surface layer is an integral part of the substrate or disposed on the surface of the substrate;
    a microstructure first conductive layer deposited in one or more patterns on the surface to make more than one device or electrode;
    a second insulation layer, wherein the second insulation layer is configured such that it covers at least some portion of the first conductive layer's one or more patterns and;
    a second conductive layer deposited in one or more patterns on the second insulation layer to form devices or electrodes, wherein the devices can be utilized for sensing, and one or more functionalization layers deposited on at least some portion of the one or more patterns of the second conductive layer, wherein the functionalization layers are adapted to provide one or more transducer sensor classes selected from the group consisting of: radiant, electrochemical, electronic; mechanical, magnetic and/or thermal devices.

2. The nano-sensor platform of claim 1, wherein the substrate is a silicon wafer and wherein the first insulating layer comprises a layer of SiO2 on the substrate.

3. The nano-sensor platform of claim 1, wherein the second conductive layer is positioned on top of the second insulation layer and over the first conductive layer so as to form one or more devices from the coupling of the layers of the structure in a measuring circuit.

4. The nano-sensor platform of claim 1, wherein the first and second conductive layers comprise conductive materials, wherein conductive materials include polysilicon, metals and alloys, and wherein the metals comprise Pt, Pd, Al, Au, Ti, Mo and further wherein the alloys include TiW and PdNi.

5. The nano-sensor platform of claim 1, wherein the devices in the first and/or the second conductive layers include electrodes, heaters and/or temperature sensors.

6. The nano-sensor platform of claim 1, wherein the second insulation layer is chosen from dielectric materials including SiO2, Si3N4, silicon oxinitride, Al2O3, polymer(s) or other suitable insulator.

7. The nano-sensor platform of claim 1, wherein the second conductive layer is patterned in multiple lock and key electrode configurations and/or a configuration with multiple electrode dimensions and multiple gap configurations.

8. The nano-sensor platform of claim 1, wherein the second conductive layer is patterned over the first conductive layer to form a capacitive couple, wherein the second conductive layer and the first conductive layer are separated by an insulation layer.

9. The nano-sensor platform of claim 8, wherein the second conductive layer pattern electrode is functionalized with a layer that can form a device such as a transistor or diode device.

10. The nano-sensor platform of claim 1, wherein the one or more functionalization layers comprise polymers, polymer composites, nanostructures, or other gas sensing materials like $In_2O_2$ or flame spray pyrolysis coatings of nanostructures for ozone sensing.

11. The nano-sensor platform of claim 1, wherein the second conductive layer comprises leads to one or more bonding pads and wherein such leads are covered with an encapsulation layer.

12. The nano-sensor platform of claim 1, wherein the one or more functionalization layers comprise Pt, Pd, Pd/Ni, PdAg, or other suitable layer for hydrogen sensors.

13. The nano-sensor platform of claim 1, wherein the one or more functionalization layers comprise a thermoelectric material comprising catalytic and noncatalytic portions for gas sensing.

14. The nano-sensor platform of claim 1, wherein the substrate is configured to thermally isolate the devices to allow temperature controlled operation at low power.

15. The nano-sensor platform of claim 11, wherein the encapsulation layer comprises Teflon, silicone, polyethylene, or polypropylene.

16. A chip sensor, comprising:
    2 or more of the nano-sensor platforms of claim 1, wherein the one or more functionalization layers are identical.

17. A chip sensor, comprising:
    2 or more of the nano-sensor platforms of claim 1, wherein the one or more functionalization layers are different.

18. A universal microelectromechanical nano-sensor platform comprising;
    a substrate including an upper surface, wherein the upper surface comprises an insulator or has an insulator layer thereon;
    a microstructure conductive layer deposited in a pattern on the surface to make several devices, wherein the conductive layer comprises one or more filaments, and wherein the filaments are disposed above and parallel to the substrate configured such that there is an air gap between the filaments and the upper surface of the substrate; and wherein filaments comprise a size/width less than 10 microns and a thickness of 1 micron or less.

19. The nano-sensor platform of claim 18, further comprising an insulation layer, wherein the insulation layer is configured such that the filaments remain exposed and are not covered by the insulation layer, but rather the insulation layer covers one or more conductive leads up to the filaments.

20. The nano-sensor platform of claim 18, wherein one or more functionalization layers are deposited on the exposed filament(s), wherein the one or more functionalization layers are adapted to provide one or more transducer platform classes selected from the group consisting of: radiant, electrochemical, electronic, mechanical, magnetic, and thermal sensing.

21. The nano-sensor platform of claim 18, wherein the filaments comprise polysilicon, or a conductive material such as Pt, Pd, SiC, or metal oxide.

22. The nano-sensor platform of claim 18, wherein the bridges comprise a material with a temperature coefficient of resistance greater than 0.003 ohms/degree C.

23. The nano-sensor platform of claim 20, wherein the one or more functionalization layers are deposited such as to create a space on and/or between the filaments, and configured such that electrical properties are measured between the filaments.

24. The nano-sensor platform of claim 18, wherein at least one of the filaments is utilized as a heater.

25. The nano-sensor platform of claim 18, wherein the substrate is back etched to improve thermal isolation and allow lower power at high temperature.

26. The nano-sensor platform of claim 18, further comprising one or more temperature sensors and heaters located on an underneath layer.

27. The nano-sensor platform of claim 19, wherein an insulation layer is deposited on exposed filament(s) to increase robustness and/or insulates leads.

28. The nano-sensor platform of claim 27, further comprising a second conductive layer deposited on the insulation layer.

29. The nano-sensor platform of claim 28, wherein the second conductive layer covers the insulation layer and extends up to and/or onto the filaments so as to provide electrodes on the filaments.

30. The nano-sensor platform of claim 29, further comprising an additional functionalization layer applied to the bridge, wherein the additional functionalization layer is applied only up to and touching the electrode that extends up to or onto the bridge.

31. The nano-sensor platform of claim 20, wherein the functionalization layer is a nanostructure material.

32. The nano-sensor platform of claim 18, wherein the filaments are configured such that the devices can operate at elevated temperatures up to 500 C using less than 10 m/W.

33. A universal microelectromechanical nano-sensor platform comprising;
    a semiconductor substrate including a surface;
    a microstructure polysilicon layer deposited in a pattern on the surface to make several devices, wherein the polysilicon layer comprises a first pair of filaments, wherein the filaments are disposed above and parallel to the semiconductor substrate with an air gap between the base of the filaments and the surface of the substrate;
    an insulation layer, wherein the insulation layer is configured such that the first pair of filaments of the polysilicon layer remain exposed and are not covered by the insulation layer;
    one or more functionalization layers deposited on the exposed pair of filaments of the polysilicon layer, wherein the one or more functionalization layers are adapted to provide one or more transducer platform classes selected from the group consisting of: radiant, electrochemical, electronic; mechanical, and thermal; and
    wherein the at least one pair of the filaments has a width of less than 10 microns.

34. The nano-sensor platform of claim 33, wherein at least one pair of filaments has a thickness of less than or equal to 1 micron.

35. The nano-sensor platform of claim 33, wherein the air gap has a height of 2-10 microns.

36. The nano-sensor platform of claim 33, wherein the air gap has a length of at least 100 microns.

37. The nano-sensor platform of claim 33, further comprising a temperature sensor and/or a heater under the surface of the substrate.

38. The nano-sensor platform of claim 18, further comprising at least 2 pairs of filaments in the same or different areas of the same chip, wherein the filaments are disposed above and separated from the substrate with an air gap between the filaments and the surface of the substrate.

39. The nano-sensor platform of claim 38, wherein the first filament(s) is configured for upstream thermal conductivity detection and the second filament(s) is configured for downstream thermal conductivity detection.

40. The nano-sensor platform of claim 38, wherein the first pair of filaments has a catalyst deposited thereon, and wherein the second pair of filaments is inert.

* * * * *